(12) United States Patent
Hayashi et al.

(10) Patent No.: US 9,586,391 B2
(45) Date of Patent: Mar. 7, 2017

(54) BONDING APPARATUS AND METHOD FOR MANUFACTURING BONDED SUBSTRATE

(71) Applicant: Shibaura Mechatronics Corporation, Yokohama-shi, Kanagawa-ken (JP)

(72) Inventors: Konosuke Hayashi, Yokohama (JP); Daisuke Matsushima, Yokohama (JP)

(73) Assignee: Shibaura Mechatronics Corporation, Yokohama-shi, Kanagawa-ken (JP)

( * ) Notice: Subject to any disclaimer, the term of this patent is extended or adjusted under 35 U.S.C. 154(b) by 0 days.

(21) Appl. No.: 14/859,627

(22) Filed: Sep. 21, 2015

(65) Prior Publication Data

US 2016/0009070 A1    Jan. 14, 2016

Related U.S. Application Data

(63) Continuation of application No. PCT/JP2014/057834, filed on Mar. 20, 2014.

(30) Foreign Application Priority Data

Mar. 26, 2013 (JP) .................. 2013-064593
Feb. 28, 2014 (JP) .................. 2014-038571

(51) Int. Cl.
*B32B 41/00* (2006.01)
*B23K 20/02* (2006.01)
*B23K 20/233* (2006.01)
*B23K 20/24* (2006.01)
(Continued)

(52) U.S. Cl.
CPC .............. *B32B 41/00* (2013.01); *B23K 20/02* (2013.01); *B23K 20/233* (2013.01); *B23K 20/24* (2013.01);
(Continued)

(58) Field of Classification Search
CPC ......... B32B 41/00; B32B 37/10; B32B 37/18; B32B 2313/00; B32B 2315/08;
(Continued)

(56) References Cited

U.S. PATENT DOCUMENTS 6,451,670 B1    9/2002  Takisawa et al.
2002/0034859 A1    3/2002  Takisawa et al.
(Continued)

FOREIGN PATENT DOCUMENTS

JP    S61-145839 A    3/1986
JP    H11-074164 A    3/1999
(Continued)

OTHER PUBLICATIONS

May 20, 2014—International Search Report—Intl App PCT/JP2014/057834.
(Continued)

*Primary Examiner* — Michael N Orlando
*Assistant Examiner* — Joshel Rivera
(74) *Attorney, Agent, or Firm* — Banner & Witcoff, Ltd.

(57) ABSTRACT

A bonding apparatus includes a substrate holder holding the second substrate; a pusher pushing a back surface of the second substrate; a substrate support unit including a support talon supporting a circumferential edge portion of the first substrate to oppose the second substrate with a prescribed spacing between the second substrate and the circumferential edge portion of the first substrate; and a controller controlling a lifting/lowering operation of the pusher. The pusher pushes one prescribed point of the back surface of the second substrate, the one prescribed point corresponding to a position where a distance between a bonding surface of the first substrate and a bonding surface of the second substrate is shorter than a distance from the circumferential edge portion of the bonding surface of the first substrate to the bonding surface of the second substrate.

16 Claims, 5 Drawing Sheets

(51) Int. Cl.
*B23K 20/26* (2006.01)
*H01L 21/67* (2006.01)
*B32B 37/10* (2006.01)
*B32B 37/18* (2006.01)
*B32B 37/00* (2006.01)

(52) U.S. Cl.
CPC .............. *B23K 20/26* (2013.01); *B32B 37/10* (2013.01); *B32B 37/18* (2013.01); *H01L 21/67092* (2013.01); *B23K 2201/40* (2013.01); *B32B 37/003* (2013.01); *B32B 2309/72* (2013.01); *B32B 2313/00* (2013.01); *B32B 2315/08* (2013.01); *B32B 2457/14* (2013.01)

(58) Field of Classification Search
CPC ............ B32B 2309/72; B32B 2457/14; H01L 21/67092; B23K 20/24; B23K 20/02; B23K 20/26; B23K 20/233; B23K 2201/40
USPC .......... 156/64, 350, 351, 368, 369, 378, 379
See application file for complete search history.

(56) References Cited

U.S. PATENT DOCUMENTS

2007/0190674 A1  8/2007  Lee et al.
2007/0287264 A1  12/2007  Rogers
2012/0190138 A1  7/2012  Tanida et al.

FOREIGN PATENT DOCUMENTS

JP    2008-182127 A    8/2008
JP    2012-156163 A    8/2012
JP    2012-191037 A    10/2012

OTHER PUBLICATIONS

May 20, 2014—(WO) Written Opinion of the ISA and International Search Report—App PCT/JP2014/057834, Eng Tran.
Apr. 11, 2016—(EP) Extended Search Report—App 14773789.4.
Oct. 20, 2016—(TW) Notification of the Examination Opinion—App 103111297, Eng Tran.

BONDING START POINT S

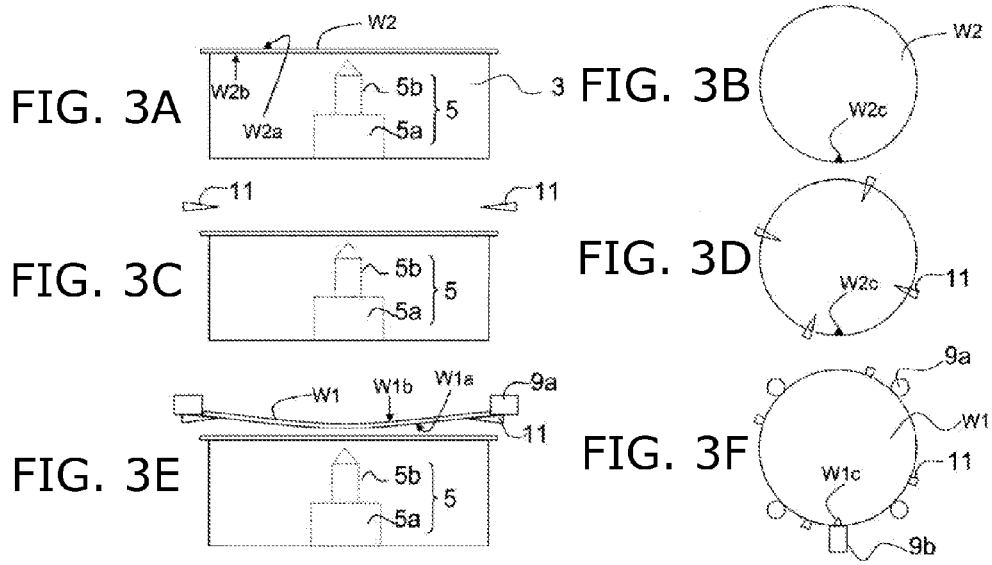
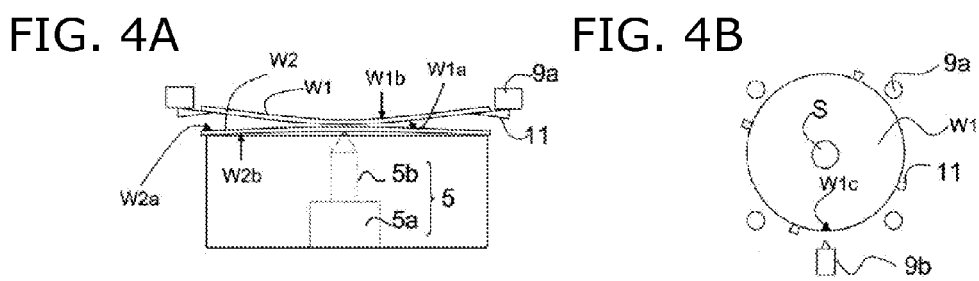
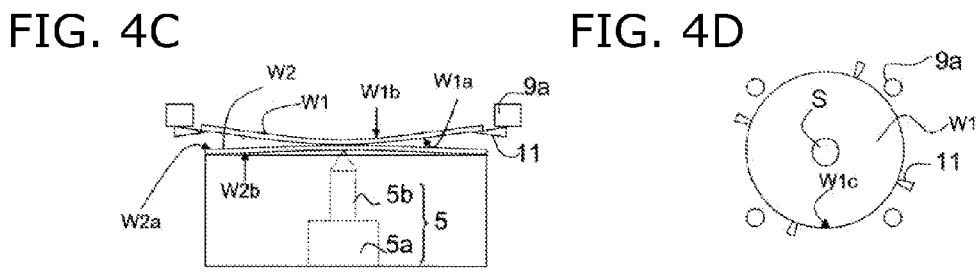

BONDING APPARATUS AND METHOD FOR MANUFACTURING BONDED SUBSTRATE

CROSS-REFERENCE TO RELATED APPLICATIONS

This is a continuation application of International Application PCT/JP2014/057834, filed on Mar. 20, 2014; the entire contents of which are incorporated herein by reference.

FIELD

Embodiments described herein relate generally to a bonding apparatus and a method for manufacturing bonded substrate.

BACKGROUND

Technology is known in which a bonded substrate, in which the polished surfaces (the bonding surfaces) of two mirror-polished wafers are bonded to each other, is formed as a wafer for a high performance device that uses a TSV process (Through Silicon Via), etc. The two wafers are bonded after performing processing such as forming an oxide layer on at least one wafer of the two wafers by plasma processing, etc. After the bonding, after increasing the bonding strength by performing heat treatment as necessary, the thickness of the bonded wafer is reduced to the desired thickness by grinding and polishing. According to such technology, the bonding to each other of substrates typified by wafers can be performed without interposing a bonding agent, etc., between the substrates. Therefore, diversification of the process conditions in the processing (high-temperature processing and chemical processing) after the bonding can be realized.

Normally, in such a bonding apparatus, the bonding is performed while pushing one substrate to be bonded in the direction of the other substrate and causing the one substrate to deform.

As recited in Patent Literature 1, a first substrate which is one substrate to be bonded is held on a stage; and a second substrate which is another substrate is opposingly arranged with a spacing between the second substrate and the first substrate in a state of the peripheral portion of the second substrate being held; and the bonding is performed while pushing, from above, one prescribed point of the surface of the second substrate on the side opposite to the bonding surface.

Also, as recited in Patent Literature 2, one semiconductor wafer to be bonded is caused to contact another semiconductor wafer in a state in which the one semiconductor wafer is held by vacuum suction to a rubber chuck and warped so that the bonding surface central portion of the one semiconductor wafer has a protruding shape; and subsequently, the bonding of the two wafers is performed by relaxing the warp of the one semiconductor wafer by introducing air, etc., into the rubber chuck interior.

However, as in Patent Literature 1, the substrate may deflect due to its own weight in the case where the circumferential edge portion of the second substrate is held. Further, in the case where the bonding is performed while pushing the second substrate from above, the deflection of the second substrate becomes large; and strain occurs in the second substrate.

Moreover, as in Patent Literature 2, even in the case where the bonding is performed by deforming the wafer in a protruding configuration to conform to the placement surface of the rubber chuck, there is a risk that strain may occur in the wafer.

In the case where such strain occurs in the bonded substrates, the alignment of the two substrates cannot be performed appropriately; and reliable bonding without shifting is difficult.

BRIEF DESCRIPTION OF THE DRAWINGS

FIG. 3A to FIG. 3F are schematic view showing a movement of the bonding apparatus 1;

FIG. 4A to FIG. 4D are schematic view showing a movement of the bonding apparatus 1;

DETAILED DESCRIPTION

Figure 1:
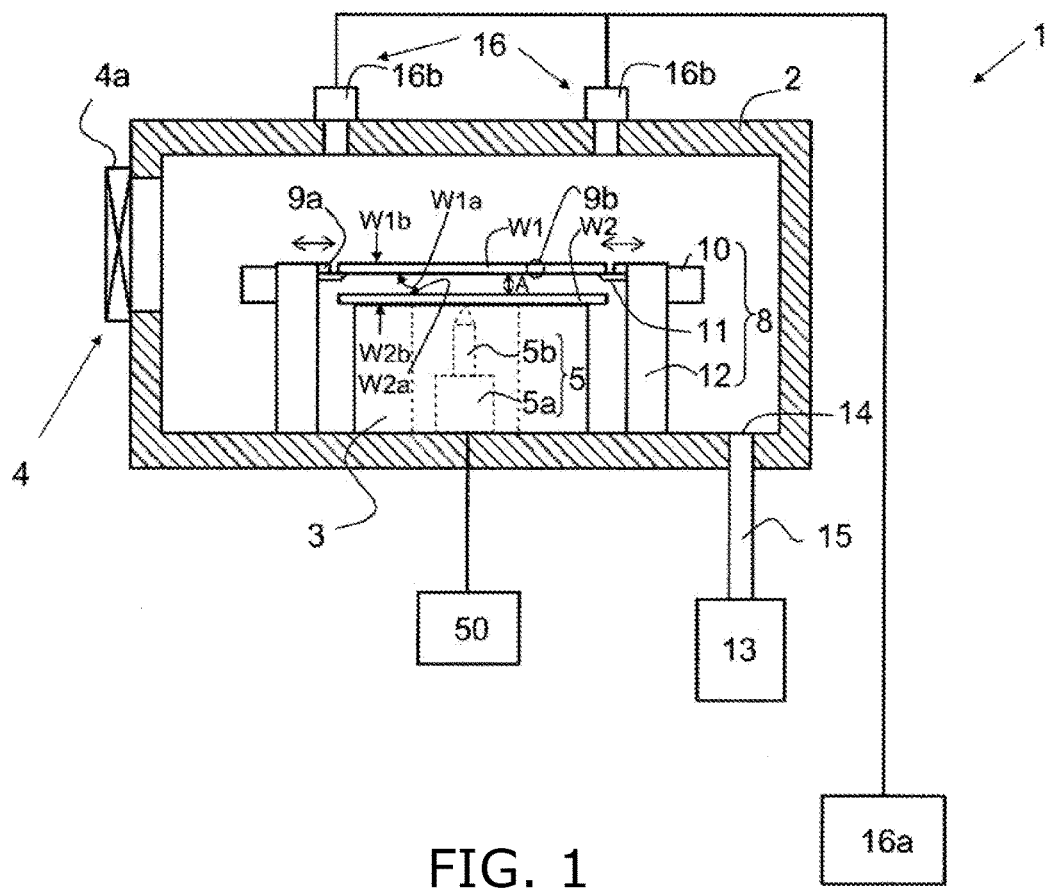
FIG. 1 is a schematic view showing a bonding apparatus according to the embodiment.

According to the embodiment of the present invention, there is provided a bonding apparatus bonding a first substrate and a second substrate, the bonding apparatus comprising: a substrate holder holding the second substrate; a pusher pushing a back surface of the second substrate by performing a lifting operation; a substrate support unit including a support talon supporting a circumferential edge portion of the first substrate to oppose the second substrate with a prescribed spacing between the second substrate and the circumferential edge portion of the first substrate; and a controller controlling a lifting/lowering operation of the pusher, the pusher pushing one prescribed point of the back surface of the second substrate, the one prescribed point corresponding to a position where a distance between a bonding surface of the first substrate and a bonding surface of the second substrate is shorter than a distance from the circumferential edge portion of the bonding surface of the first substrate to the bonding surface of the second substrate.

According to another embodiment of the present invention, there is provided a method for manufacturing a bonded substrate, a first substrate and a second substrate being bonded in the bonded substrate, the method comprising: holding the second substrate; supporting a circumferential edge of the first substrate to oppose the second substrate with a prescribed spacing between the second substrate and the circumferential edge of the first substrate; pushing a back surface of the second substrate; and performing a bonding of the first substrate and the second substrate, the bonding surface of the first substrate and the bonding surface of the second substrate being contacted, the pushing the back surface of the second substrate including using a pusher to push one prescribed point of the second substrate, the one prescribed point corresponding to a position where a distance between a bonding surface of the first substrate and a bonding surface of the second substrate is shorter than a distance from a circumferential edge portion of the bonding surface of the first substrate to the bonding surface of the second substrate.

[First Embodiment] (Bonding Apparatus 1)

A first embodiment will now be illustrated with reference to the drawings. Similar constituent features in the drawings are marked with like reference numerals, and a detailed description is omitted as appropriate.

FIG. 1 is a schematic view showing a bonding apparatus according to the embodiment.

FIG. 1 shows the bonding apparatus 1 that directly bonds, without interposing a bonding agent, substrates to be bonded to each other, e.g., two silicon wafers. In the direct bonding of the embodiment, a bonding start point S is formed when bonding surfaces having undergone activation processing are pushed at one prescribed point; and the bonding progresses spontaneously from the one prescribed point due to hydrogen bonding.

As shown in FIG. 1, a processing container 2, a substrate holder 3, a pushing unit 5, a substrate support unit 8, an exhaust unit 13, a detector 16, and an opening 4 are provided in the bonding apparatus 1.

(Processing Container 2)

The processing container 2 has an airtight structure and can maintain an atmosphere that is more depressurized than atmospheric pressure.

The opening 4 that includes an opening door 4a is provided in the side wall of the processing container 2; a first substrate W1 and a second substrate W2 can be transferred inside; and a substrate (a bonded substrate) W after the bonding can be transferred out.

Also, an exhaust port 14 is provided in the bottom of the processing container 2; and the exhaust of the processing container 2 can be performed. As described below, because the bonding can be performed in a vacuum or at atmospheric pressure, the exhaust port 14 may not be provided if the exhaust port 14 is unnecessary.

(Substrate Holder 3)

The substrate W2 is placed on the holding surface of the substrate holder 3 and is supported in a horizontal state.

The substrate holder 3 has a ring configuration when viewed in plan; the upper surface of the ring configuration is used as the holding surface described above; and a suction unit such as a vacuum chuck, etc., is provided in the holding surface. The substrate holder 3 holds the substrate W2 by suction of the circumferential edge portion of a back surface W2b of the substrate W2 by the suction unit. In other words, the region of the center of the back surface W2b of the substrate W2 is not held by the substrate holder 3.

The substrate holder 3 can be moved in the horizontal direction by a not-shown movement unit.

(Pushing Unit 5)

The pushing unit 5 is disposed to be positioned in a hollow portion made in the center of the substrate holder 3.

The pushing unit 5 includes a pusher 5b, includes a movement unit 5a that controls the movement operation of the pusher 5b, and pushes one prescribed point of the back surface W2b (the surface on the side opposite to the bonding surface) of the substrate W2 toward the direction of the substrate W1. The movement unit 5a can move the pusher 5b in the vertical direction, can move the pusher 5b in the horizontal direction, and can cause the pusher 5b to oppose any location of the back surface W2b of the substrate W2. In other words, the pushing unit 5 and the substrate holder 3 are movable individually without colliding into each other.

The pusher 5b is, for example, a member such as a pin; and it is favorable for the tip configuration of the pusher 5b to push the back surface W2b of the substrate W2 by the lifting operation of the pusher 5b. For example, a needle-like configuration, a tapered configuration, or a spherical configuration can be used. By the pusher 5b being driven by the movement unit 5a, it is possible to position the tip portion of the pusher 5b at any position between a standby position that is positioned below the holding surface (the upper surface) of the substrate holder 3 and a lift end position that protrudes a prescribed amount from the holding surface of the substrate holder 3.

In the specification, the pusher 5b performing the lifting operation is called "pushing" the substrate W2. A further description of the pusher 5b is described below.

(Substrate Support Unit 8)

The substrate support unit 8 supports the substrate W1 to oppose a front surface W2a (the bonding surface) of the substrate W2. The substrate support unit 8 includes multiple (e.g., four) support talons 11, a movement unit 10 that moves the support talons 11, and a base unit 12 that supports the movement unit 10. The substrate W1 is supported with spacing A provided between the substrate W1 and the second substrate W2 by the substrate W1 being placed on the support talons 11.

(Support Talons 11)

The multiple support talons 11 are disposed along the circumferential edge portion of the substrate W1, support the circumferential edge portion of a front surface W1a of the substrate W1, and dispose the substrate W1 above the substrate W2.

(Movement Unit 10)

The movement unit 10 moves the support talons 11 between positions that support the substrate W1 and positions retreated in the diametrically-outward direction of the substrate W1. For example, the movement unit 10 can include a control motor such as a servo motor, a pulse motor, etc., as a component.

(First Alignment Units 9a)

The first alignment units 9a align the positions in the horizontal direction of the substrate W1 and the substrate W2 based on information relating to the alignment detected by the detector 16 described below. The first alignment units 9a have, for example, pin configurations and are multiply arranged along the circumferential edge portion of the substrate W1 supported by the support talons 11.

For example, the first alignment units 9a can contact or be separated from the side surface of the substrate W1 by advance/retreat operations in the diametrical direction of the substrate W1 by a not-shown movement unit including a control motor such as a servo motor, a pulse motor, etc. In such a case, the first alignment units 9a can perform the alignment of the substrate W1 by pushing the outer circumferential edge of the substrate W1 supported by the support talons 11 in the horizontal direction by moving a designated amount in the direction of contacting the side surface of the substrate W1.

(Second Alignment Unit 9b)

The second alignment unit 9b aligns the positions in the rotation direction of the substrate W1 and the substrate W2 based on the information relating to the alignment detected by the detector 16 described below. In such a case, for example, the second alignment unit 9b can align the substrate W2 in the rotation direction by inserting a pin into a notch provided in the circumferential edge of the substrate W2.

(Exhaust Unit 13)

The exhaust unit 13 exhausts the air inside the processing container 2 from the exhaust port 14 via a pipe 15.

The bonding may be performed at atmospheric pressure without providing the processing container 2.

(Detector 16)

The detector 16 includes a detection head 16b and a calculator 16a. The detector 16 detects the positions in the horizontal direction of the substrate W1 and the substrate W2 by detecting the horizontal positions of the circumferential edge portions of the substrate W1 and the substrate W2. Also, the detector 16 detects the positions in the rotation direction of the substrate W1 and the substrate W2 by detecting the notch positions provided in the substrate W1 and the substrate W2.

For example, the detection head 16b can be provided in the ceiling portion of the processing container 2. The detection head 16b can be, for example, a CCD image sensor (Charge Coupled Device Image Sensor). Although the number of the detection heads 16b is not particularly limited, the detection precision can be increased by providing multiple detection heads 16b.

The calculator 16a is electrically connected to the detection head 16b. Based on the information from the detection head 16b, the calculator 16a calculates the relative positions of the substrate W1 and the substrate W2 and makes information relating to the alignment such as the shift amount, shift direction, etc., between the two. The information relating to the alignment is transmitted to the movement unit 10 of the substrate support unit 8, the first alignment units 9a, and the second alignment unit 9b and is used when performing the alignment between the substrate W1 and the substrate W2.

The pusher 5b described above will now be elaborated.

Figure 2:
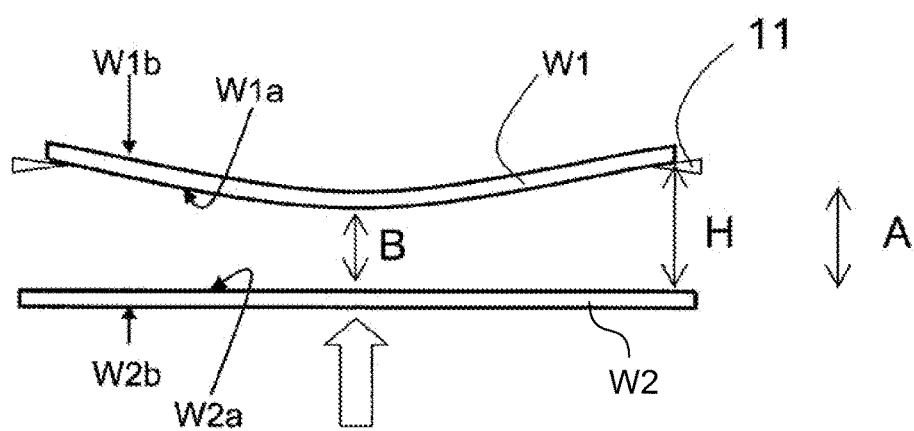
FIG. 2 is a schematic view showing the bonding state of a first substrate W1 and a second substrate W2.

In the case where the substrate W1 is a substrate such as an extremely thin wafer, a large wafer having a diameter of 450 mm, etc., the substrate having the circumferential edge portion supported by the support talons 11 as in FIG. 2 may undesirably deflect due to its own weight.

Also, the substrate W1 may warp at the point in time in the transfer into the processing container 2.

In the case where the deformation amount of the substrate W1 is large, the front surface W1a and the front surface W2a may not be able to contact and the bonding may not progress if the pushing on the substrate W2 is insufficient and the time is short. Also, bonding with reproducibility is difficult because the deflection amount and the warp amount of the substrate W1 are not constant and are affected by the environment such as the temperature inside the processing chamber, etc.

Here, the spacing A in FIG. 2 is the distance between the front surface W1a (the bonding surface) of the substrate W1 and the front surface W2a (the bonding surface) of the substrate W2. Spacing B is the distance between the front surface W1a and the front surface W2a at the position where the spacing A is the smallest. Spacing H is the distance between the front surface W2a and the circumferential edge portion of the front surface W1a at the bonding start. In other words, the spacing H is the height from the front surface W2a to the contact surfaces of the support talons 11 for the substrate W1.

In the case where the substrate W1 is held in a flat state at the bonding start, the distance between the substrate W1 and the front surface W2a is a constant spacing H in the surface of the front surface W1a. However, in the case where the substrate W1 is deformed due to deflecting and/or warp, a position occurs where the distance between the substrate W1 and the front surface W2a in the surface of the front surface W1a is smaller than the spacing H.

In other words, there are cases where the distance between the front surface W2a and a prescribed point in the surface of the front surface W1a is smaller than the spacing H.

The pusher 5b pushes one prescribed point of the substrate W2 corresponding to the bonding start point S from the back surface W2b (the side opposite to the bonding surface) side, where the bonding start point S is the position in the surface of the front surface W1a where the distance between the front surface W1a and the front surface W2a is smaller than the spacing H.

The position in the surface of the front surface W1a where the distance between the front surface W1a and the front surface W2a is smaller than the spacing H can be set to be, for example, the position (of the spacing B) where the spacing A is the smallest.

The position where the spacing A is the smallest can be set to be, for example, a region having the centroid of the substrate W1 as a center or can be the center of the substrate W1. Also, for example, the position where the spacing A is the smallest can be predetermined by calculations from the surface area of the substrate W1 and/or the positions where the substrate W1 is supported.

The operations of the bonding apparatus 1 and the method for manufacturing the bonded substrate will now be illustrated.

FIG. 3 are schematic views showing the processes of the bonding processing; FIGS. 3A, 3C, and 3E are schematic views as viewed from the side surface of the bonding apparatus 1; and FIGS. 3B, 3D, and 3F are schematic views as viewed from directly above the bonding apparatus 1.

FIG. 4 are schematic views showing the processes of the bonding processing continuing from FIG. 3; FIGS. 4A and 4C are schematic views as viewed from the side surface of the bonding apparatus 1; and FIGS. 4B and 4D are schematic views as viewed from directly above the bonding apparatus 1.

FIG. 5 are schematic views showing the processes of the bonding processing continuing from FIG. 4; FIGS. 5A and 5C are schematic views as viewed from the side surface of the bonding apparatus 1; and FIGS. 5B and 5D are schematic views as viewed from directly above the bonding apparatus 1.

First, the substrate W2 is transferred into the processing container 2 by a not-shown transfer robot. Also, the pusher 5b is positioned at the standby position.

Then, as in FIGS. 3A and 3B, the second substrate W2 is placed on the substrate holder 3 and subsequently is held by a vacuum chuck, etc.

Then, the rotation-direction position of the substrate W2 is detected by the detector 16 detecting the position of a notch W2c of the substrate W2. Also, the horizontal-direction position of the substrate W2 is detected by the detector 16 by detecting the horizontal position of the circumferential edge portion of the substrate W2.

Then, as in FIGS. 3C and 3D, the support talons 11 are moved to locations to support the substrate W1.

Then, as in FIGS. 3E and 3F, the substrate W1 is transferred into the interior of the processing container 2 by a not-shown transfer robot and placed on the support talons 11.

Continuing, by using the information relating to the relative horizontal-direction positions of the substrate W2 and the substrate W1 detected by the detector 16, the horizontal-direction position of the substrate W1 is aligned with the horizontal-direction position of the substrate W2 by the first alignment units 9a. For example, the horizontal-direction position of the substrate W1 is aligned with the horizontal-direction position of the substrate W2 by causing the first alignment units 9a to contact the circumferential edge of the substrate W1 and by moving the first alignment units 9a the amount of the size of the shift amount between the horizontal-direction position of the substrate W2 and the horizontal-direction position of the substrate W1.

Continuing, the position of a notch W1c provided in the circumferential edge of the substrate W1 is detected by the detector 16. At this time, by moving the substrate holder 3 that holds the substrate W2 in the horizontal direction, the substrate W2 is moved in the horizontal direction to a position that does not obstruct the detection of the position of the notch W1c of the substrate W1. After detecting the position of the notch W1c, the substrate holder 3 that holds the substrate W2 is moved in the horizontal direction to align the substrate W2 with the horizontal position of the substrate W1 (to return the substrate W2 to the position of FIG. 4A).

Continuing, by using the information relating to the rotation-direction position of the substrate W2 (the position of the notch W2c) and the rotation-direction position of the substrate W1 (the position of the notch W1c) detected by the detector 16, the rotation-direction position of the substrate W2 is aligned by the second alignment unit 9b. For example, the rotation-direction position of the substrate W2 is aligned with the rotation-direction position of the substrate W1 by inserting the pin of the second alignment unit into the notch W2c provided in the circumferential edge of the substrate W2 and moving the pin in the rotation direction of the substrate W2 by the amount of the size of the shift amount of the rotation-direction position of the substrate W2 with respect to the rotation-direction position of the substrate W1.

Then, the substrate W1 and the substrate W2 are bonded. First, the opening/closing door 4a is closed; and the processing container 2 is sealed. Then, the interior of the processing container 2 is exhausted. It is unnecessary to exhaust the processing container 2 in the case where the bonding is performed inside ambient air.

Then, as in FIGS. 4A and 4B, the first alignment units 9a and the second alignment unit 9b are moved to positions retreated from the circumferential edge portion of the substrate W1. In other words, the alignment by the first alignment units 9a and the second alignment unit 9b is released. Then, the pusher 5b is moved horizontally and aligned at a position opposing the bonding start point S, where the bonding start point S is the position where the spacing A is the smallest. The horizontal movement operation can be controlled by a controller 50. The controller 50 can control the horizontal movement operation of the movement unit 5a according to the positional information of the bonding start point S that is set in the horizontal direction of the substrate W2.

Subsequently, the movement unit 5a is controlled by the controller 50; and the lifting operation of the pusher 5b is performed.

Then, as in FIGS. 4C and 4D, the pusher 5b is lifted and the back surface of the substrate W2 is pushed so that the bonding surface is caused by the pusher 5b to have a protruding configuration. The lifting operation of the pusher 5b is continued until the tip portion of the pusher 5b reaches the lift end position.

The lift end position is such that strain does not remain in the substrate even when the pusher 5b pushes the substrate up and can be a position such that the tip portion of the pusher 5b protrudes 0.5 mm or more from the holding surface of the substrate holder 3. For example, the lift end position of the pusher 5b can be set to be a position that is more proximal to the substrate holder 3 than are the height position of the contact surfaces of the support talons 11 for the substrate W1. Also, for example, in the lifting process of the pusher 5b, the lift end position of the pusher 5b can be set to be a position separated further from the substrate holder 3 than the point in time when the portions of the front surface W1a and the front surface W2a contact (this contact portion is used as the bonding start point S).

After the tip portion of the pusher 5b reaches the lift end position, the pusher 5b is maintained at this position. Then, as in FIGS. 4C and 4D, the support talons 11 are moved gradually in the direction to be separated from the circumferential edge of the substrate W1. When the support talons 11 are moved in the direction to be separated from the circumferential edge, the portions of the substrate W1 that are supported by the support talons 11 move toward the circumferential edge portion side of the substrate W1; the deflection of the substrate W1 becomes large due to its own weight; and the height-direction position in the surface of the substrate W1a decreases.

Here, for the front surface W1a and the front surface W2a, the contact may be started by the front surface W2a being pushed by the lifting operation of the pusher 5b described above; or the contact may be started by the height-direction position in the surface of the front surface W1a decreasing due to the movement of the support talons 11 of FIGS. 4C and 4D. In the case of the latter, at the stage prior to the movement start of the support talons 11, the front surface W1a and the front surface W2a are in a state of not contacting at the point in time when the pusher 5b is positioned at the lift end position.

After the front surfaces W1a and W2a contact, the bonding progresses in a radial configuration from the point of contact. Even after the front surface W1a and the front surface W2a contact, because the support talons 11 continue to move in the direction to be separated from the circumferential edge of the substrate W1, the height position in the surface of the substrate W1 also continues to decrease; and the portion where the front surface W1a of the substrate W1 and the front surface W2a of the substrate W2 contact (the bonded portion) enlarges from the central portion toward the circumferential edge portion as in FIGS. 5A and 5B. Then, when the circumferential edge portion of the substrate W1 is released from the support talons 11, the front surface W1a of the substrate W1 and the front surface W2a of the substrate W2 contact over the entire surface. In other words, the bonded substrate W is formed in which the substrate W1 and the substrate W2 are bonded.

The release of the alignment by the first alignment units 9a and the second alignment unit 9b of FIGS. 4A and 4B described above may be performed as the bonding progresses after the pusher 5b is lifted rather than prior to lifting the pusher 5b.

Figure 5A:
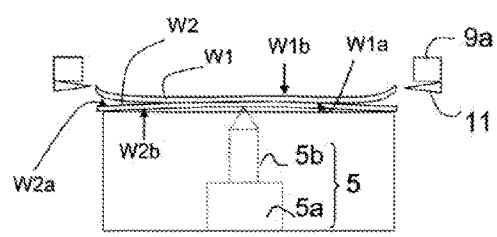
FIG. 5A to FIG. 5D are schematic view showing a movement of the bonding apparatus 1.
Figure 5B:
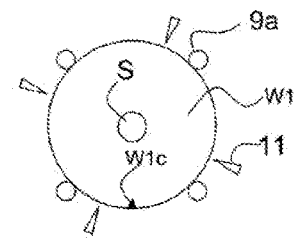
Figure 5C:
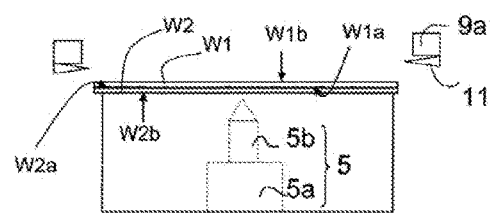
Figure 5D:
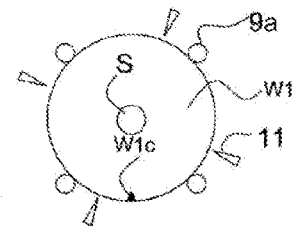

Then, the pusher 5b is lowered by the movement unit 5a as shown in FIGS. 5C and 5D.

Here, until the bonding of the substrate W1 and the substrate W2 is completed, the protruding configuration of the bonding surface of the substrate W2 is maintained as-is because the pusher 5b is positioned at the lift end position protruding from the holding surface of the substrate holder 3. In other words, the bonding between the substrate W1 and the substrate W2 starts from the bonding start point S by the spacing A of the substrate W1 and the substrate W2 being relatively proximal. That is, the bonding between the substrate W1 and the substrate W2 is started from the bonding start point S by causing the spacing A of the substrate W1 and the substrate W2 to be relatively proximal. Then, the bonding progresses with the protruding configuration of the front surface W2*a* of the substrate W2 maintained as-is; and the bonded substrate W that is deformed in a protruding configuration is formed. After the bonding of the substrate W1 and the substrate W2 is completed, a lowering operation of the pusher 5*b* is performed; and the pusher 5*b* returns to the original position (the position of FIG. 3A). When the pusher 5*b* is lowered, the bonded substrate W that had been deformed by the pusher 5*b* conforms to the holding surface of the substrate holder 3 and becomes flat.

The completion of the bonding of the substrate W1 and the substrate W2 may be detected by a sensor provided inside the bonding apparatus 1 or may be detected from the time determined from an experiment.

After the processing container 2 is returned to ambient air, the bonded substrate W is transferred outside the processing container 2 by a not-shown transfer apparatus.

Thereafter, the bonding of the substrate W1 and the substrate W2 can be performed continuously as necessary by repeating the processes described above.

According to the embodiment, the pusher 5*b* is positioned at the position protruding from the holding surface of the substrate holder 3 until the bonding of the substrate W1 and the substrate W2 has completed. Thereby, the region of the substrate W2 that is not held by the substrate holder 3 is held; and the contact point between the substrate W1 and the substrate W2 can be maintained from the bonding start to the completion.

In other words, there is a hollow portion in the central region of the substrate holder 3 because the substrate holder 3 has the ring configuration. Therefore, the central region of the substrate W2 is not held by the substrate holder 3. The central region of the substrate W2 is held by the pusher 5*b* protruding from the holding surface of the substrate holder 3. Also, the substrate W1 and the substrate W2 contact due to the pusher 5*b* protruding from the holding surface of the substrate holder 3. The contact point between the substrate W1 and the substrate W2 can be maintained from the bonding start to the bonding completion by maintaining the protruding position of the pusher 5*b*.

As a result, the front surface W1*a* and the front surface W2*a* can reliably contact; and the bonding can be started reliably.

Also, according to the embodiment, by continuing the lifting operation of the pusher 5*b* even after the front surface W1*a* and the front surface W2*a* contact, and by stopping the pusher 5*b* at the lift end position that is more distal to the substrate holder 3 than is the position where the front surface W1*a* and the front surface W2*a* contact, the front surface W1*a* and the front surface W2*a* can be caused to contact reliably; and the bonding can be performed reliably. In other words, when the pusher 5*b* is lifted even after the front surfaces W1*a* and W2*a* contact, the substrate W1 that contacts the substrate W2 also is pushed; and the substrate W1 deforms to conform to the substrate W2 at the contact point. Accordingly, the surface of the contact point of the front surface W1*a* and the front surface W2*a* can be larger than when the front surfaces W1*a* and W2*a* contacted at the height position where the front surfaces W1*a* and W2*a* contact. In other words, because the surface area of the bonding start point S can be set to be large, the bonding can be started reliably; and the bonding can be performed reliably. Further, by setting the lift end position to be a position more proximal to the substrate holder 3 than is the height position of the contact surfaces of the support talons 11 for the substrate W1, the bonding can be performed with the circumferential edge of the substrate W1 held as-is by the support talons 11 at the bonding start when the contact surface of the substrate W2 is small; and the bonding can be performed without shifting of the substrate W1.

Also, according to the embodiment, the push amount of the substrate W2 can be reduced by using the position where the spacing A is the smallest as the bonding start point S. As a result, the change of the configuration in the surface of the substrate W2 can be reduced; and the occurrence of the strain of the substrate W2 can be deterred. As a result, the bonding in which the shifting of the substrate W1 is deterred can be performed.

Also, there is a risk that air may enter at the bonding surface and many voids (voids) may occur if the position where the spacing A between the substrate W1 and the substrate W2 is the smallest is shifted from the bonding start point S, i.e., the position of the point where the substrate W2 is pushed from the back surface.

According to the embodiment, by pushing the substrate W2 from the back surface using one prescribed point at the position where the spacing A is the smallest as the bonding start point S, the occurrence of the voids can be deterred.

In the embodiment, the lift end position of the pusher 5*b* may be set to be a preset position or may be a position determined in real time. In the case of determining in real time, for example, the height position where the front surfaces W1*a* and W2*a* contact can be detected by a pressure sensor provided in the pusher 5*b*; and a position that is more distal to the substrate holder 3 than this position can be used as the lift end position.

Although the pusher 5*b* moves horizontally and is positioned at the bonding start point S prior to the bonding start in the embodiment, as long as the pusher 5*b* is positioned at the bonding start point S beforehand, the pusher 5*b* may not move; and the horizontal position of the pusher 5*b* may be fixed.

Although the pusher 5*b* is positioned at the position protruding from the holding surface of the substrate holder 3 until the bonding between the substrate W1 and the substrate W2 is completed in the embodiment, in the case where the lift end position of the pusher 5*b* is a position that is more distal to the substrate holder 3 than is the height position where the front surfaces W1*a* and W2*a* contact, the pusher 5*b* may be lowered and returned to the standby position (the position of FIG. 3A) after the pusher 5*b* is lifted to the lift end position and the front surface W1*a* and the front surface W2*a* contact. As described above, because the bonding can be started reliably if the lift end position of the pusher 5*b* is a position that is more distal to the substrate holder 3 than is the height position where the front surfaces W1*a* and W2*a* contact, it is unnecessary thereafter to maintain the contact point by the lifting of the pusher 5*b*.

Although the exhaust is performed after the alignment of the substrates W1 and W2 in the embodiment, the exhaust may be performed after the substrate W1 is transferred into the processing container 2 and prior to the alignment.

The holding surface of the substrate holder 3 that holds the substrate W2 may be a flat surface or a curved surface. In other words, the substrate W2 may be held in a horizontal state or may be held to have a curved surface.

Although the controller 50 controls the movement operation of the movement unit 5*a* in the embodiment, the controller 50 can be used as a controller of the entire bonding apparatus 1 that controls operations of other components. For example, the holding operation of the substrate holder 3, the support operation of the substrate support unit 8 (the operations of the first and second alignment units 9*a* and 9*b* and the support talons 11), the exhaust pressure control of the exhaust unit 13, etc., can be controlled.

[Second Embodiment]

Figure 6:
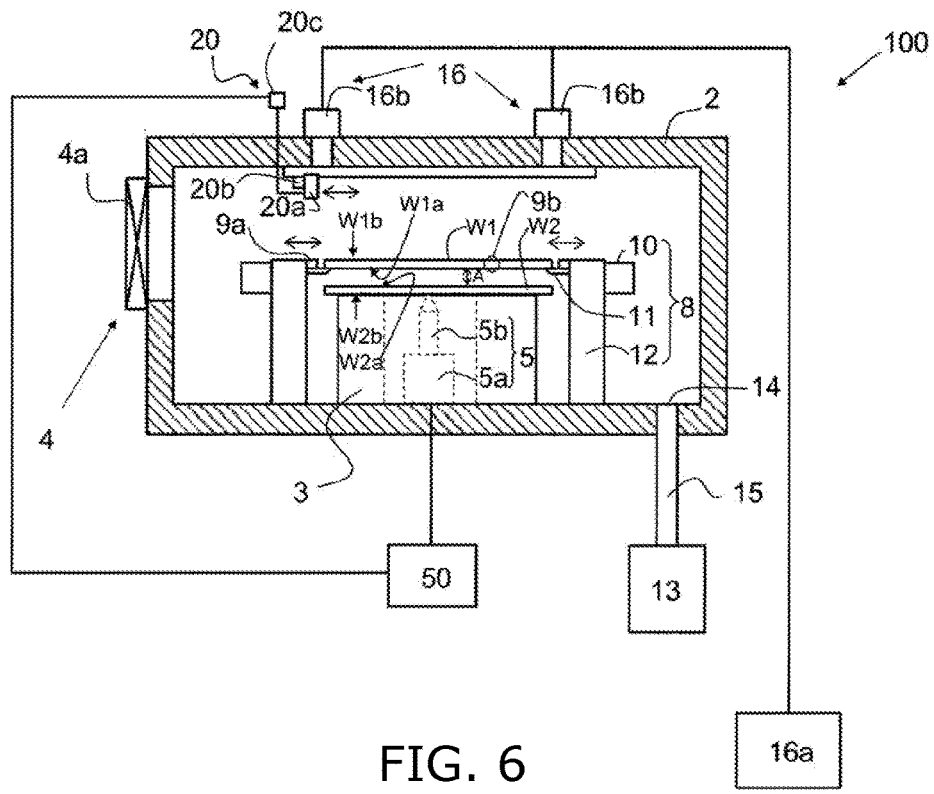
FIG. 6 is a schematic view showing a bonding apparatus 100 according to a second embodiment.

FIG. 6 is a schematic view showing a bonding apparatus according to a second embodiment.

The same components as those of the first embodiment are marked with like reference numerals, and a description is omitted. In FIG. 6, the bonding apparatus 100 includes a measurement unit 20. The measurement unit 20 can measure the deformation state of the substrate W1.

(Measurement Unit 20)

The measurement unit 20 includes a measurement head 20a, a movement unit 20b, and a calculator 20c. The measurement head 20a measures the deformation state of the substrate W1 by converting the deformation amount of the substrate W1 into an electrical signal. For example, the measurement head 20a can be a laser displacement sensor, etc., and transmits information of the displacement of the height position of the substrate W1, etc., to the calculator 20c as an electrical signal by scanning a back surface W1b of the substrate W1. The movement unit 20b changes the relative positions of the measurement head 20a and the substrate by, for example, moving the measurement head 20a along the diametrical direction (the lateral direction in FIG. 3) of the substrate W1. The movement unit 20b can include, for example, a control motor such as a servo motor, a pulse motor, etc., as a component.

The calculator 20c determines the deformation state of the substrate W1 by converting the electrical signal from the measurement head 20a into the deformation amount of the substrate W1. Then, from the determined deformation state, the calculator 20c transmits, to the controller 50, the information of the maximum deformation amount of the substrate W1 and the position where the deformation amount of the substrate W1 is a maximum. Based on this information, the controller 50 controls the movement amount of the pusher 5b in the horizontal direction and thickness direction of the substrate W2. For example, the controller 50 sets the bonding start point S to be the position where the deformation amount of the substrate W1 is a maximum and controls the movement amount in the horizontal direction of the pusher 5b so that the pusher 5b is positioned at a position opposing the bonding start point. Then, when performing the lifting operation of the pusher 5b, the pusher 5b is lifted so that the tip portion of the pusher 5b reaches the same interface as the holding surface of the substrate holder 3 and is further lifted a distance to be the same as the deformation amount of the substrate W1.

In the first embodiment described above, the bonding start point S is set to be the position where the spacing A is the smallest; and, for example, this position is set to be the region having the centroid of the substrate W1 as the center, is set to be the center of the first substrate W1, or is predetermined by calculations from the surface area of the substrate W1 and the position where the first substrate W1 is supported. Conversely, in the second embodiment, the deformation state of the substrate W1 is measured by the measurement head 20a; the position where the spacing A between the substrate W1 and the substrate W2 is the smallest is determined by the calculator 20c; and this position is set as the bonding start point S. Otherwise, the operations are similar to those of the first embodiment and are therefore abbreviated.

According to the bonding apparatus 100 according to the embodiment, in addition to effects similar to those of the first embodiment, it is possible to measure the deformation state of the substrate W1, determine the bonding start point S based on the measurement results, and control the movement of the pusher 5b in the horizontal direction or thickness direction of the substrate W2 based on the start point position. Thereby, the bonding can be performed more accurately in real time from the position where the substrate W1 and the substrate W2 are most proximal. As a result, the bonding can be started using the optimal horizontal position or the optimal push amount for the substrate W2 according to the warp amount of the substrate W1; and the strain of the substrate W1 can be suppressed.

Although the measurement unit 20 is provided at the ceiling portion of the processing container 2 and the deformation state is measured from above the substrate W1 in FIG. 6, this is not limited thereto. For example, the deformation state of the substrate W1 may be measured by disposing the measurement unit 20 in the horizontal direction of the substrate W1. For example, a pair of measurement units 20 (a light projecting sensor and a light receiving sensor) can be opposingly arranged; and the deformation state of the substrate W1 can be measured by scanning the light projecting sensor in the vertical direction in a range having the substrate W1 interposed in the thickness direction of the substrate W1 and by the light receiving sensor measuring the regions where the light projected from the light projecting sensor is received/blocked.

Although the controller 50 controls the movement operation of the movement unit 5a in the example, the controller 50 can be used as a controller of the entire bonding apparatus 100 that controls operations of other components. For example, the holding operation of the substrate holder 3, the support operation of the substrate support unit 8 (the operations of the first and second alignment units 9a and 9b and the support talons 11), the exhaust pressure control of the exhaust unit 13, etc., can be controlled.

[Third Embodiment]

Figure 7:
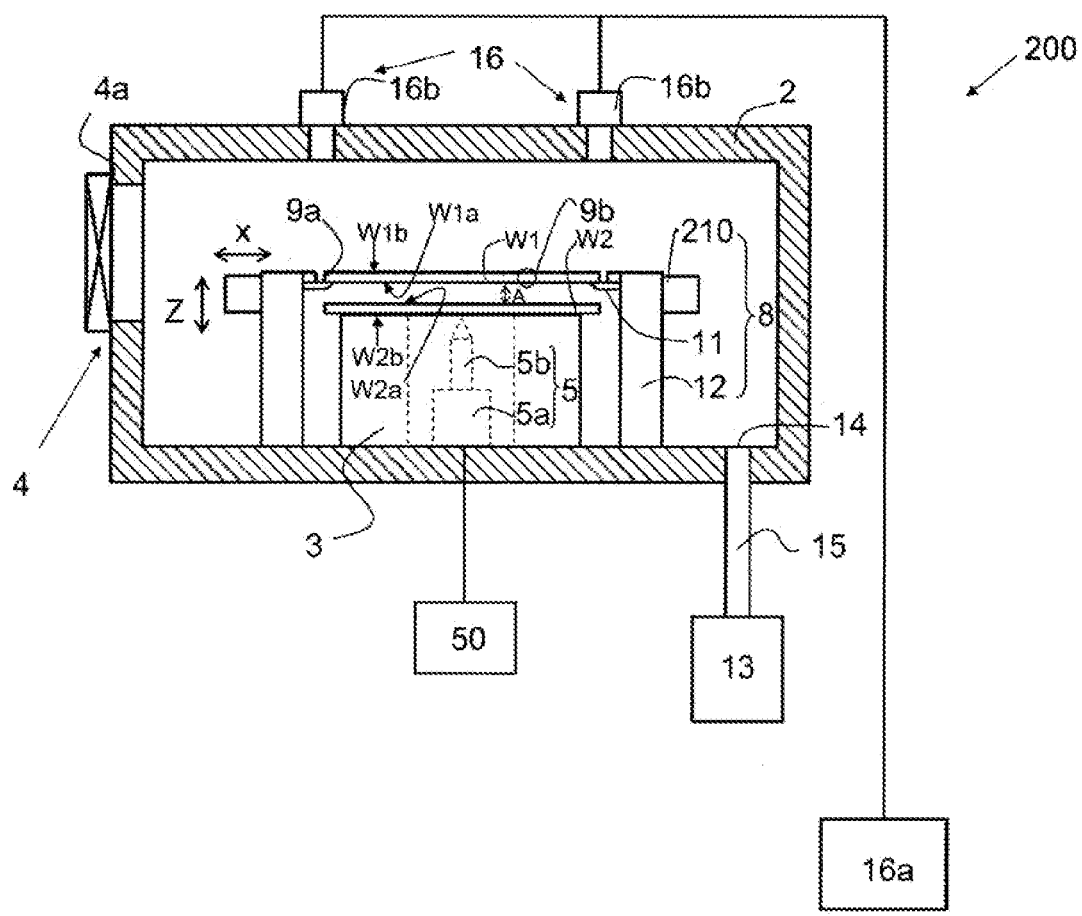
FIG. 7 is a schematic view of a bonding apparatus 200 according to a third embodiment.

FIG. 7 is a schematic view of a bonding apparatus 200 according to a third embodiment.

The same components as those of the first embodiment are marked with like reference numerals, and a description is omitted. In FIG. 7, a movement unit 210 of the bonding apparatus 200 moves the support talons 11 between the position where the substrate W1 is supported and the positions retreated in the diametrically-outward direction of the substrate W1 (the X-direction in FIG. 7). Also, the movement unit 210 moves the support talons 11 between the substrate holder 3 and the positions where the substrate W1 is supported (the Z-direction in FIG. 7). In other words, in the third embodiment, the movement unit 210 can move the support talons 11 in the X-axis direction and the Z-axis direction. The movement unit 210 can include, for example, a control motor such as a servo motor, a pulse motor, etc., as a component.

Operations of the bonding apparatus 200 and a method for manufacturing the bonded substrate will now be illustrated.

Because the processes of introducing the substrate W1 and the substrate W2 to the process of alignment in the embodiment are similar to FIGS. 3A to 3F described in the first embodiment, a description is omitted; and the subsequent processes are described with reference to FIG. 8.

In other words, FIG. 8 are schematic views showing the processes of the bonding processing continuing from FIG. 3; FIGS. 8A and 8C are schematic views as viewed from the side surface of the bonding apparatus 1; and FIGS. 8B and 8D are schematic views as viewed from directly above the bonding apparatus 1.

FIG. 9 are schematic views showing the processes of the bonding processing continuing from FIG. 8; FIGS. 9A and 9C are schematic views as viewed from the side surface of the bonding apparatus 1; and FIGS. 9B and 9D are schematic views as viewed from directly above the bonding apparatus 1.

Figure 8A:
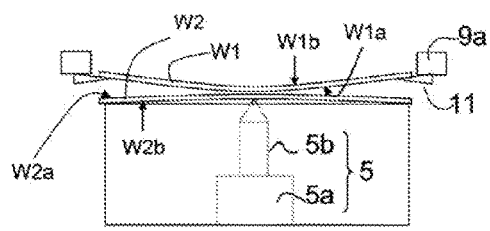
FIG. 8A to FIG. 8D are schematic view showing a movement of the bonding apparatus 200.
Figure 8B:
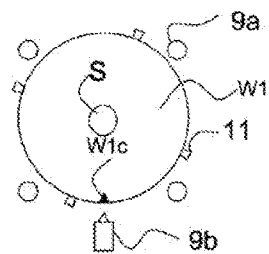

As in FIGS. 8A and 8B, the first alignment units 9a and the second alignment unit 9b are moved to positions retreated from the circumferential edge portion of the substrate W1; and the alignment is released. Then, the pusher 5b is moved horizontally to a position opposing the bonding start point S and is aligned. This alignment is similar to that of the first embodiment, and a description is therefore omitted.

Then, as in FIGS. 8A and 8B, the pusher 5b is lifted; and the back surface of the substrate W2 is pushed so that the bonding surface is caused by the pusher 5b to have a protruding configuration. The lifting operation of the pusher 5b stops when the lift end position is reached. The lift end position is similar to that of the first embodiment, and a description is therefore omitted.

After the front surfaces W1a and W2a contact, the bonding progresses in a radial configuration from the point of contact.

Figure 8C:
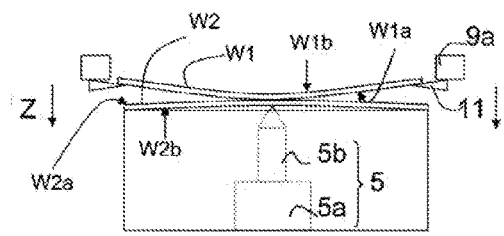
Figure 8D:
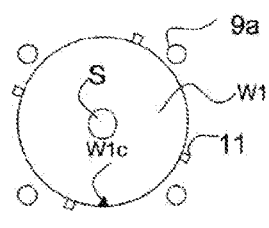

Here, as in FIG. 8C, the support talons 11 are moved in a first direction (the Z-direction in FIG. 7) after the contact of the substrate W1 and the substrate W2. The first direction can be a direction in which the circumferential edge portion of the substrate W1 and the circumferential edge portion of the substrate W2 approach each other. Then, the support talons 11 are moved in a second direction. The second direction can be a direction (the X-direction in FIG. 7) in which the support talons 11 retreat from the circumferential edge portion of the substrate W1. The support talons 11 start to move in the second direction after starting the movement in the first direction and prior to the bonding of the circumferential edge portion of the first substrate W1 and the circumferential edge portion of the second substrate W2 is completed. In other words, the movement of the support talons 11 in the second direction can be performed during the movement in the first direction or after the movement in the first direction has stopped.

When the support talons 11 are moved in the first direction, the bonding progresses while the circumferential edge portion of the substrate W1 and the circumferential edge portion of the substrate W2 approach each other. Therefore, as in FIGS. 9A and 9B, the portion where the front surface W1a of the substrate W1 and the front surface W2a of the substrate W2 contact (the bonded portion) enlarges from the central portion toward the circumferential edge portion. Then, when the circumferential edge portion of the substrate W1 is caused to be released from the support talons 11 by moving the support talons 11 in the second direction, the front surface W1a of the substrate W1 and the front surface W2a of the substrate W2 contact over the entire surface. In other words, the substrate W is formed in which the substrate W1 and the substrate W2 are bonded.

Figure 9A:
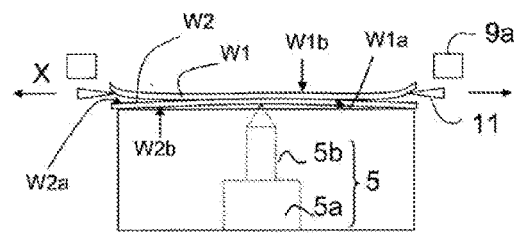
FIG. 9A to FIG. 9D are schematic view showing a movement of the bonding apparatus 200.
Figure 9B:
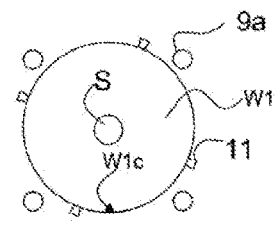
Figure 9C:
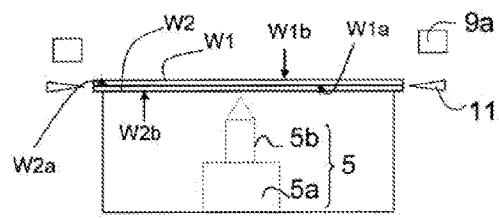
Figure 9D:
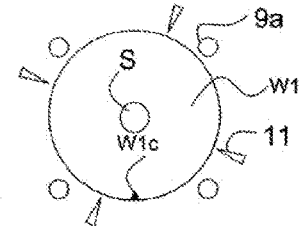

Then, as shown in FIGS. 9C and 9D, the pusher 5b is lowered by the movement unit 5a.

The bonded substrate W is transferred outside the processing container 2 by a not-shown transfer apparatus.

According to the embodiment, the bonding can be performed while reducing the spacing of the substrate W1 and the substrate W2 by moving the support talons 11 in the first direction to cause the circumferential edge portion of the substrate W1 and the circumferential edge portion of the substrate W2 to approach each other and by moving the support talons 11 in the second direction so that the support talons 11 retreat from the circumferential edge portion of the substrate W1 after the contact of the substrate W1 and the substrate W2. As a result, air can be prevented from entering between the bonding surfaces; and the occurrence of the voids can be deterred.

The embodiments have been illustrated above. However, the invention is not limited to these descriptions.

Those skilled in the art can suitably modify the above embodiments by addition, deletion, or design change of components, or by addition, omission, or condition change of processes, and such modifications are also encompassed within the scope of the invention as long as they fall within the spirit of the invention.

For example, the configurations, dimensions, materials, arrangements, numbers, etc., of the components included in the bonding apparatus, etc., are not limited to those illustrated and can be modified appropriately.

Also, although a bonding apparatus in which the direct bonding of two silicon wafers is performed is described as an example in the embodiments described above, applications are possible also in a bonding apparatus in which a silicon wafer and a support substrate are bonded with a bonding layer interposed, a bonding apparatus in which substrates (e.g., glass substrates) other than silicon wafers are bonded, etc.

Further, the components included in the embodiments described above can be combined within the extent of feasibility; and such combinations are included in the scope of the invention to the extent that the features of the invention are included.

What is claimed is:

1. A bonding apparatus bonding a first substrate and a second substrate, the bonding apparatus comprising:
   a substrate holder having a holding surface, the second substrate held on the holding surface in a horizontal state;
   a pusher provided on a back side of the second substrate, the pusher pushing a back surface of the second substrate by performing a lifting operation;
   a substrate support unit including a support talon supporting a circumferential edge portion of the first substrate, the first substrate being supported on an upper side of the second substrate, the first substrate being supported to oppose the second substrate with a prescribed spacing between the second substrate and the first substrate; and
   a controller controlling a lifting/lowering operation of the pusher,
   wherein the pusher pushes one prescribed point of the back surface of the second substrate, the one prescribed point corresponding to a position where a distance between a bonding surface of the first substrate and a bonding surface of the second substrate is shorter than a distance from the circumferential edge portion of the bonding surface of the first substrate to the bonding surface of the second substrate.

2. The bonding apparatus according to claim 1, wherein the controller controls so that the lifting operation of the pusher is performed when the pusher pushes the back surface of the second substrate, and controls so that a lowering operation of the pusher is performed after the bonding of the first substrate and the second substrate is completed.

3. The bonding apparatus according to claim 1, wherein the controller controls so that the lifting operation is continued after the bonding surface of the first substrate and the bonding surface of the second substrate contact until the pusher reaches a lift end position.

4. The bonding apparatus according to claim 3, wherein a distance between the lift end position of the pusher and the substrate holder is smaller than a distance between a height position of a contact surface of the support talon for the first substrate and the substrate holder.

5. The bonding apparatus according to claim 1, comprising a movement unit moving the pusher in a horizontal direction of the second substrate to cause the pusher to locate the one prescribed point of the second substrate, the one prescribed point corresponding to a position where the distance between the bonding surface of the first substrate and the bonding surface of the second substrate is the shortest.

6. The bonding apparatus according to claim 1, comprising a measurement unit provided to measure a deformation state of the first substrate, and a movement unit moving the pusher in a horizontal direction or a thickness direction of the second substrate to push the one prescribed point of the back surface of the second substrate according to the deformation state of the first substrate measured by the measurement unit.

7. The bonding apparatus according to claim 1, wherein the controller controls a movement of the support talon to move the support talon in a first direction to cause the circumferential edge portion of the first substrate to approach a circumferential edge portion of the second substrate after the contact of the first substrate and the second substrate and to subsequently move the support talon in a second direction to retreat from the circumferential edge portion of the first substrate.

8. A method for manufacturing a bonded substrate, a first substrate and a second substrate being bonded in the bonded substrate, the method comprising:
holding the second substrate by a substrate holder, the substrate holder having a holding surface, the second substrate held on the holding surface in a horizontal state;
supporting the first substrate by a substrate support unit, the substrate support unit including a support talon supporting a circumferential edge portion of the first substrate, the first substrate being supported on an upper side of the second substrate, the first substrate being supported to oppose the second substrate with a prescribed spacing between the second substrate and the first substrate;
pushing a back surface of the second substrate by a lifting operation of a pusher, the pusher provided on a back side of the second substrate; and
performing a bonding of the first substrate and the second substrate in a state in which the bonding surface of the first substrate and the bonding surface of the second substrate are contacted,
wherein the pushing the back surface of the second substrate includes using the pusher to push one prescribed point of the second substrate, the one prescribed point corresponding to a position where a distance between a bonding surface of the first substrate and a bonding surface of the second substrate is shorter than a distance from a circumferential edge portion of the bonding surface of the first substrate to the bonding surface of the second substrate.

9. The method for manufacturing the bonded substrate according to claim 8, wherein the pushing the back surface of the second substrate includes performing a lifting operation of the pusher, and includes performing, after the bonding of the first substrate and the second substrate is completed, a lowering operation of the pusher.

10. The method for manufacturing the bonded substrate according to claim 8, wherein the performing the bonding of the first substrate and the second substrate includes continuing performing the lifting operation after the bonding surface of the first substrate and the bonding surface of the second substrate contact until the pusher reaches a lift end position.

11. The method for manufacturing the bonded substrate according to claim 10, wherein the lift end position of the pusher is a position more proximal to a substrate holder than is a height position of a contact surface of a support talon for the first substrate.

12. The method for manufacturing the bonded substrate according to claim 8, including moving the pusher in a horizontal direction of the second substrate to cause the pusher to push the one prescribed point of the second substrate before the pushing the back surface of the second substrate, the one prescribed point corresponding to a position where the distance between the bonding surface of the first substrate and the bonding surface of the second substrate is the shortest.

13. The method for manufacturing the bonded substrate according to claim 8, including measuring a deformation state of the first substrate before the pushing the back surface of the second substrate and moving the pusher in a horizontal direction or a thickness direction of the second substrate to push the one prescribed point of the back surface of the second substrate according to the measured deformation state of the first substrate.

14. The method for manufacturing the bonded substrate according to claim 8, wherein the performing the bonding of the first substrate and the second substrate includes moving the support talon in a first direction to cause a circumferential edge portion of the first substrate to approach a circumferential edge portion of the second substrate after the first substrate and the second substrate contact, and subsequently moving the support talon in a second direction to retreat from the circumferential edge portion of the first substrate.

15. The bonding apparatus according to claim 1, wherein the substrate holder has a ring configuration when viewed in plan, an upper surface of the ring configuration being used as the holding surface.

16. The bonding apparatus according to claim 1, wherein the pusher is disposed to be positioned in a hollow portion made in the center of the substrate holder.

* * * * *